(12) United States Patent
Franosch et al.

(10) Patent No.: US 7,234,237 B2
(45) Date of Patent: Jun. 26, 2007

(54) METHOD FOR PRODUCING A PROTECTIVE COVER FOR A DEVICE

(75) Inventors: Martin Franosch, München (DE); Andreas Meckes, München (DE); Klaus-Günter Oppermann, Holzkirchen (DE)

(73) Assignee: Infineon Technologies AG, Munich (DE)

( * ) Notice: Subject to any disclaimer, the term of this patent is extended or adjusted under 35 U.S.C. 154(b) by 486 days.

(21) Appl. No.: 10/821,798

(22) Filed: Apr. 9, 2004

(65) Prior Publication Data
US 2005/0148205 A1    Jul. 7, 2005

(30) Foreign Application Priority Data
Apr. 11, 2003    (DE) ................................ 103 16 777

(51) Int. Cl.
*H01R 43/00* (2006.01)
(52) U.S. Cl. ............................ 29/885; 29/417; 29/856; 29/858; 29/883; 73/159; 73/204.11; 73/204.26; 156/268; 156/344; 156/643; 257/701; 257/704; 427/249; 427/258; 427/402; 427/404; 438/110; 438/125; 438/455; 438/458; 438/976
(58) Field of Classification Search ................. 29/417, 29/592.1, 602.1, 856, 858, 883, 885; 73/159, 73/204.11, 204.17, 204.26, 721; 156/268, 156/344, 643; 427/249, 258, 402, 404; 438/455, 438/458, 976, 110, 125; 257/701, 704
See application file for complete search history.

(56) References Cited

U.S. PATENT DOCUMENTS

| | | | |
|---|---|---|---|
| 5,262,000 A | 11/1993 | Welbourn et al. | 156/643 |
| 5,357,807 A | 10/1994 | Guckel et al. | 72/721 |
| 5,771,902 A | 6/1998 | Lee et al. | 128/897 |
| 6,030,515 A | 2/2000 | Heyers et al. | 205/118 |
| 6,454,160 B2 * | 9/2002 | Gueissaz | 228/256 |
| 6,955,950 B2 * | 10/2005 | Aigner et al. | 438/125 |

FOREIGN PATENT DOCUMENTS

| | | |
|---|---|---|
| DE | 69019530 T2 | 10/1995 |
| DE | 69116532 T2 | 10/1996 |
| DE | 19732250 A1 | 1/1999 |
| DE | 10200869 A2 | 7/2003 |
| EP | 0373360 B1 | 10/1995 |

* cited by examiner

Primary Examiner—Paul D. Kim
(74) Attorney, Agent, or Firm—Maginot, Moore & Beck

(57) ABSTRACT

In a method for producing a protective cover for a device formed in a substrate, at first a sacrificial structure is produced on the substrate, wherein the sacrificial structure comprises a first portion covering a first area of the substrate including the device and a second portion extending from the first portion into a second area of the substrate including no device. Then a first cover layer is deposited that encloses the sacrificial structure such that the second portion of the sacrificial structure is at least partially exposed. Then the sacrificial structure is removed, and the structure formed by the removal of the sacrificial structure is closed.

15 Claims, 9 Drawing Sheets

A)

B)

C)

D)

A)

B)

METHOD FOR PRODUCING A PROTECTIVE COVER FOR A DEVICE

CROSS REFERENCE TO RELATED APPLICATION

Cross Reference is made to co-pending application entitle "Method for Producing a Protective Cover for a Device", Ser. No. 10/820,652, filed on Apr. 8, 2004.

BACKGROUND OF THE INVENTION

1. Field of the Invention

The present invention relates to a method for producing a protective cover for a device, and in particular to the production of a protective cover for devices containing areas whose function would be impeded by injection-molding housings, such as SAW filters (SAW=surface acoustic wave), BAW filters (BAW=bulk acoustic wave), resonators, sensors, e.g. surface-micromechanical sensors, e.g. acceleration sensors, rotation rate sensors and the like, actors and/or devices with surface-micromechanical structures the function of which would be impeded by an injection-molding housing. In particular, the present invention relates to a method for producing such a protective cover for the devices on wafer level.

2. Description of the Related Art

Conventionally, devices are produced on and/or in a substrate, wherein after completion of the device the substrate including the device is arranged in an injection-molding housing in a protected manner. In this arrangement, the substrate and the device are completely embedded in the material of the injection-molding housing at least in the area of the device. This procedure is disadvantageous for devices whose function is impeded by this material, which thus require a clearance for proper operability, as this is for example required in the above-mentioned devices.

A known approach to solve these problems with reference to injection-molding housing is to provide a "counter-substrate" in which a corresponding opening is inserted, so that when assembling the device substrate and the housing substrate the cavity is arranged in the area of the device in the device substrate, so that here no further impeding of the device occurs. On wafer level, a wafer is correspondingly produced with a corresponding structure for the devices (system wafer), which is connected to a second wafer (lid wafer) having corresponding pits and holes having been produced for example by etching it, e.g. by a bond procedure. In this manner, the pits of the second wafer will form cavities above the sensitive structures of the first wafer, the contact pads of the first wafer being accessible through holes in the second wafer. Hereby, the sensitive structures are protected. Alternatively to the procedures just described, ceramic housings are also used.

The disadvantage of this solution is that here always a second substrate or a second wafer is to be structured, which requires processing and machining separate from the first wafer. This leads to very expensive overall production and also increases the requirements with respect to the required process accuracy. A further disadvantage of the procedure is that in the connection of the lid wafer to the system wafer pressure and temperature have additionally to be applied, and that the requirements on the surface quality and purity are correspondingly high. A further, even more serious disadvantage is that during this bond process the micro-electromechanical structures are already exposed so that here an additional yield risk exists.

In the post-published German patent application DE 102 00 869 A, an alternative method is described, which describes a sacrificial layer and a cover element formed by a photoresist. The sacrificial layer is formed over the area of the substrate in which the device is formed, in which the cavity is to be produced later. Over the sacrificial layer, a photoresist layer is deposited in which holes are inserted to expose the sacrificial layer in the area of the holes. Then the sacrificial layer is removed by suitable measures, and the holes in the photoresist layer are closed. The disadvantage of this procedure is to be seen in the structuring of the holes in the resist layer above the sacrificial layer. Due to the great thickness of the resist (lacquer) (>1 µm), the rough and greatly reflecting sacrificial layer, as long as metals are used for this, and the strong dependency of the hole size and hole quality on the lacquer thickness, the dose in the exposure of the lacquer and the sacrificial layer surface it is not possible to produce holes with diameters of less than 5 µm in a clean and reliable manner. This leads to an intolerable restriction of the yield. A further disadvantage is that here the stability of the lid layer is reduced by many holes in the lid. In addition, when closing the so-formed holes for etching having a size of more than 1 µm, there is the danger that closing material, e.g. SU-8, enters the cavity via these holes for etching over the cavity.

EP 0 373 360 B1 describes a method for producing an improved insulation in VLSO and ULSI circuits, wherein here also a cavity is to be formed. Here the cavity is also structured by a sacrificial layer removed by one or more openings in a surface of the arrangement. Thus, here the same problems occur, as they have been previously described.

SUMMARY OF THE INVENTION

It is the object of the present invention to provide a simplified and reliable method for producing a protective cover for devices, which enables the production of a protective cover in a simple manner without separate processing of further wafers and/or substrates being required, which enables the production of a stable protective cover and avoids contamination of the cavities below the protective cover.

In accordance with a first aspect, the present invention provides a method for producing a protective cover for a device, wherein a substrate is provided that includes the device, the method including: (a) creating a sacrificial structure on the substrate, wherein the sacrificial structure has a first portion covering a first area of the substrate including the device and a second portion extending from the first portion into a second area of the substrate including no device; (b) depositing a first cover layer enclosing the sacrificial structure such that the second portion of the sacrificial structure is at least partially exposed; (c) removing the sacrificial structure; and (d) closing the structure formed by the removal of the sacrificial structure.

According to the invention, the above-described approach is abandoned, in which the exposing of the cavity is performed by removing the sacrificial structure via openings in a resist layer disposed above the sacrificial structure. According to the invention, the sacrificial structure is structured such that the second portion is formed, which is partially covered by the subsequently deposited cover layer, so that here no lateral channel for etching results. If now the corresponding etchant is applied to the structure, a lateral etching of the sacrificial layer is performed by the exposed second portion, so that the cavity above the sensitive substrate is finally produced by the lateral channel. Since on the one hand structuring of the cover layer is required during the production, and on the other hand the etching of the sacrificial structure is required, the materials used for these two structures each have to be unsusceptible to the etching materials used for etching the other layer. Preferably, different materials are therefore used for the sacrificial layer process and the closing process. An advantage of the inventive approach is that high end strength of the cover is now additionally achieved, which is even great enough to be injection-molded safely and without yield losses.

According to a further preferred embodiment of the present invention, producing the sacrificial structure first includes applying a photoresist layer on the substrate, structuring it to expose the first area and the second area of the substrate, and concluding growing the sacrificial material on the exposed areas of the substrate.

Preferably, the cover layer is formed by applying a photoresist layer on the structure resulting after the first production step, wherein the photoresist layer is at first applied so that the sacrificial layer is completely enclosed. Then the so-applied photoresist layer is structured in order to preferably expose an end of the second portion of the sacrificial structure facing away from the first portion of the sacrificial structure.

According to a further preferred embodiment, closing the formed structure takes place by applying a second cover layer, and structuring the second cover layer such that the second covet layer covers the first cover layer and closes the cavity formed by the removal of the sacrificial structure, wherein the first and second cover layers may consist of the same material.

According to a further embodiment, it may be provided to first form an opening in the first cover layer to expose a portion of the sacrificial structure, wherein this opening is closed again after removing the sacrificial structure.

The sacrificial structure may be produced from photoresist, metal, or oxide.

According to a further preferred embodiment of the present invention, the device includes a micromechanical structure formed in the substrate with movable parts. In the production of such movable parts in a substrate, sacrificial structures are also employed that have conventionally been removed after the completion of the structures. According to the invention, it is now started from a device whose micromechanical structures formed in the substrate or the associated movable parts are also fixed by a further sacrificial structure. In this case, the sacrificial structure is applied on the substrate surface such that it is in connection to the further sacrificial structure or borders thereon. The sacrificial structure and the further sacrificial structure are then removed together in one step or successively in several steps in order to thus form the cavity on the one hand and expose the movable parts of the micromechanical structure on the other hand.

The advantage of this procedure is that here both the sacrificial layer of the micromechanical structure and the sacrificial layer for the production of the cavity below the lid may be executed directly after each other or even in one step. A further advantage is that during the bond process for connecting the wafers the micromechanical structures now still lie fixed, so that here the yield is increased additionally.

According to a further preferred embodiment, the production of the protective cover takes place on wafer level, wherein here a plurality of devices, like or different devices, are formed in a wafer, wherein the previously described steps are performed for all devices on the wafer. Then the wafer may be diced, wherein contact pads and dicing lines are fixed on the wafer in advance by the first cover layer or the second cover layer.

BRIEF DESCRIPTION OF THE DRAWINGS

These and other objects and features of the present invention will become clear from the following description taken in conjunction with the accompanying drawings, in which.

DESCRIPTION OF THE PREFERRED EMBODIMENTS

Figure 1:
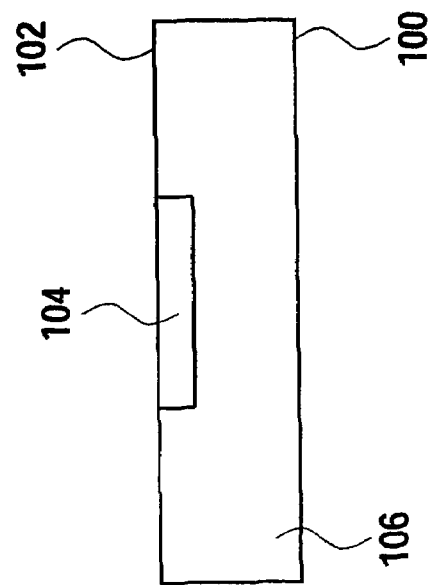
FIGS. 1 to 5 show the steps for the production of a protective cover according to the invention, wherein the figure parts A are a top-view illustration of a substrate with the device and wherein the figure parts B are a sectional illustration along the line shown in the figure part A.
Figure 1:
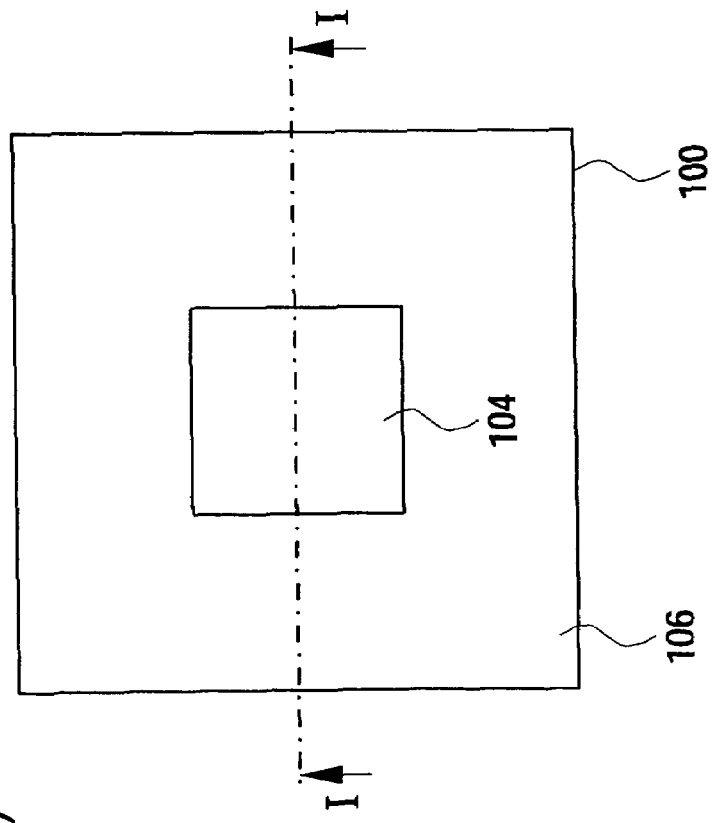

In the subsequent description of the preferred embodiments of the present invention like reference numerals are used for the elements illustrated in the various drawings and appearing similar.

On the basis of FIGS. 1–5 the production method for a protective cover according to the invention is subsequently explained in greater detail. In FIG. 1, a substrate 100 is shown that includes a first surface 102, wherein the substrate 100 includes a first area 104 in which a device is formed and a second area 106 in which no device is formed. The devices formed in the area 104 are devices including at least areas whose function would be impeded by a housing, i.e. whose function requires a clearance above the involved areas. In this respect it is to be pointed out that in the figures the area 104 is indicated as the device area in an abstract manner, wherein here, however, in fact that area of a device formed in the substrate 100 is meant whose functionality requires a clearance or cavity. The involved elements may be BAW filters, SAW filters, resonators, sensors or actors. Likewise, surface-micromechanical sensors may be formed, whose function would be impeded by the housing, such as acceleration sensors, rotation rate sensors, and the like.

FIG. 1 shows the substrate after the required procedural steps for the production of a device in the substrate 100 have been completed and the so-produced structure is to be provided with a protective cover.

Figure 2:
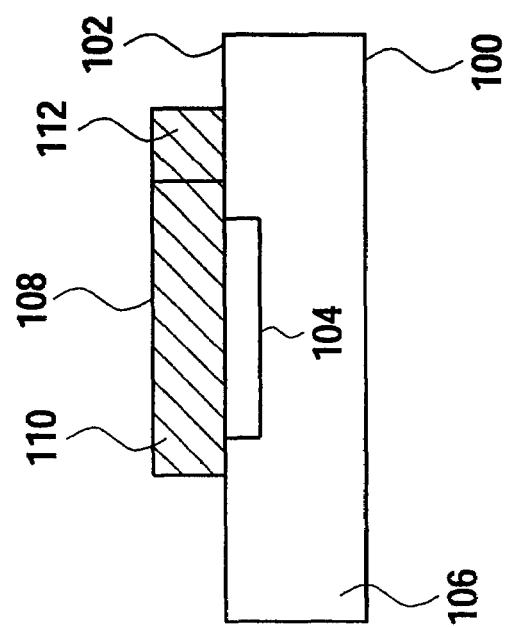
Figure 2:
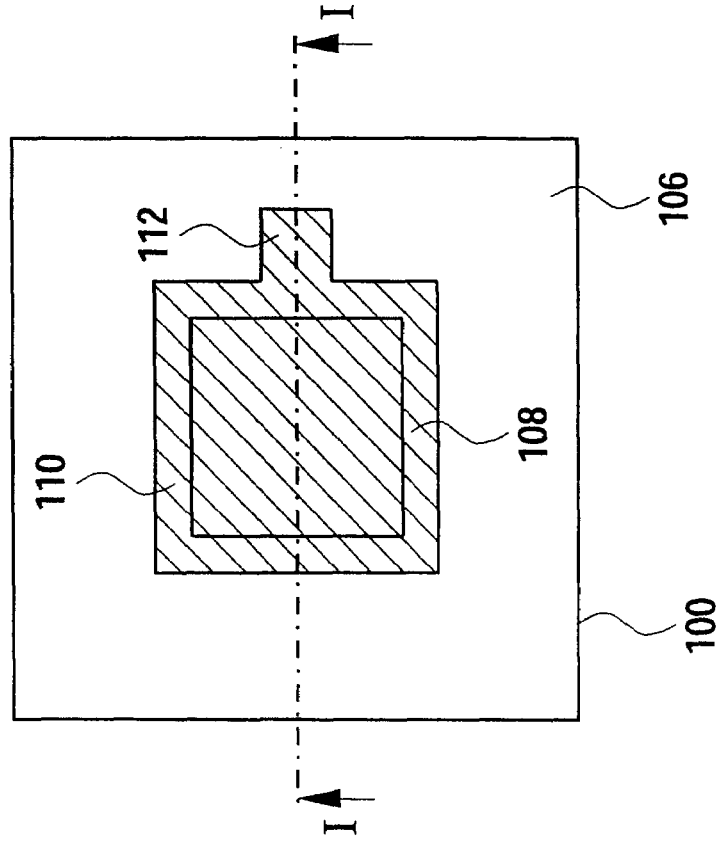

According to the invention, as illustrated in FIG. 2, at first a structured sacrificial layer 108 is applied on the surface 102 of the substrate 100, wherein the sacrificial layer 108 is structured such that it includes a first portion 110 and a second portion 112. By the sacrificial layer 108 and in particular by the first portion 110 thereof, a cavity to be formed later above the area 104 in the substrate 100 is fixed, wherein the portion 112 of the sacrificial layer serves to fix a channel for etching, as will be explained later. As can be seen from FIG. 2, the first portion 110 of the sacrificial layer 108 is formed such that it covers at least the area 104 in the substrate above which a cavity is to be formed, wherein the portion 110 of the sacrificial layer 108 preferably extends slightly beyond this area. The second portion 112 of the sacrificial layer 108 extends starting from the first portion 110 into the area 106 of the substrate.

Figure 3:
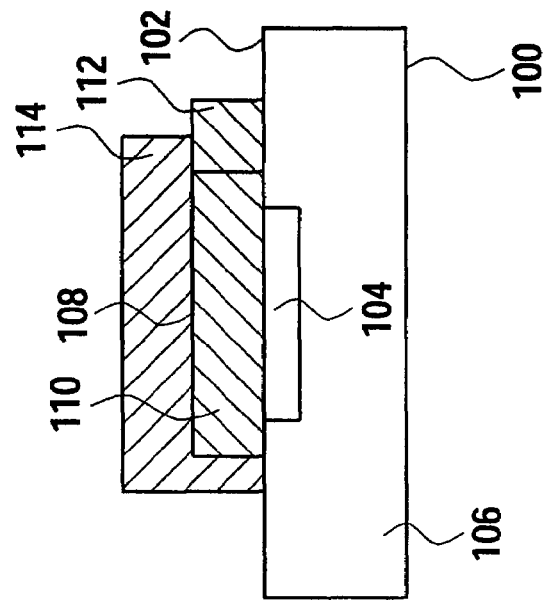
Figure 3:
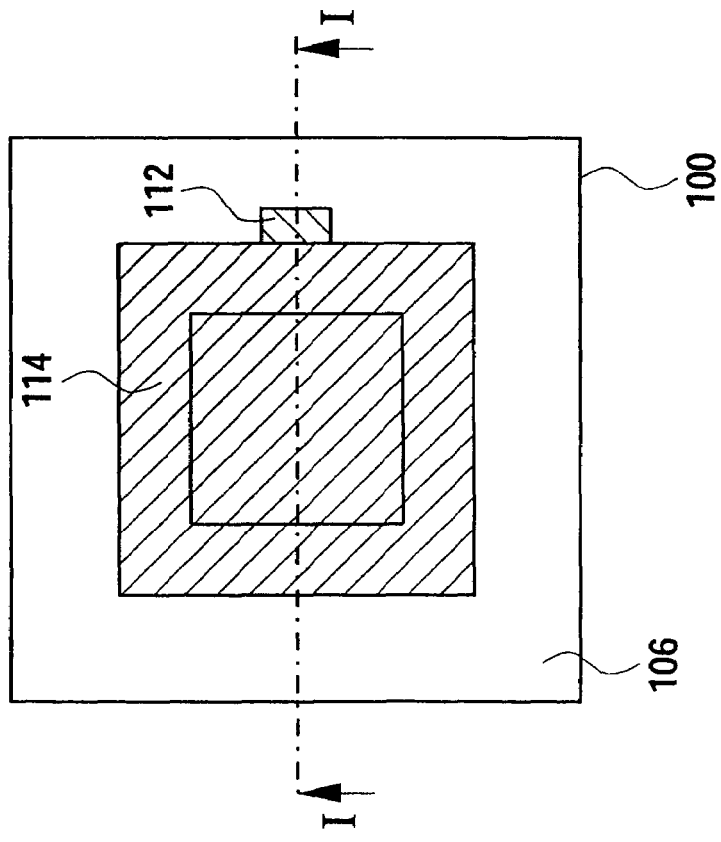

Subsequently, a cover layer 114 is applied on the so-produced structure, as this is shown in FIG. 3. As can be seen from FIG. 3B, the cover layer 114 has been applied on the surface 102 and on the sacrificial layer 108 and structured such that the first portion 110 of the sacrificial layer 108 is completely covered by the cover layer 114. Furthermore, the cover layer 114 has been structured to expose at least a portion of the second portion 112 of the sacrificial layer 108 so that in this place a medium required for removal of the sacrificial layer 108 may attack the sacrificial layer.

After the layer 114 has been deposited, the sacrificial layer 108 is subsequently removed by suitable media so that the structure shown in FIG. 4 results, in which the sacrificial layer 108 has been completely removed so that above the area 104 a cavity 116 exists which is, in this procedural step, still in connection to the environment via a channel for etching 118. More specifically, the cavity 116 has been defined by removing the first portion 110 of the sacrificial layer 108, and the channel for etching 118 has been defined by removing the second portion 112 of the sacrificial layer 108.

Figure 4:
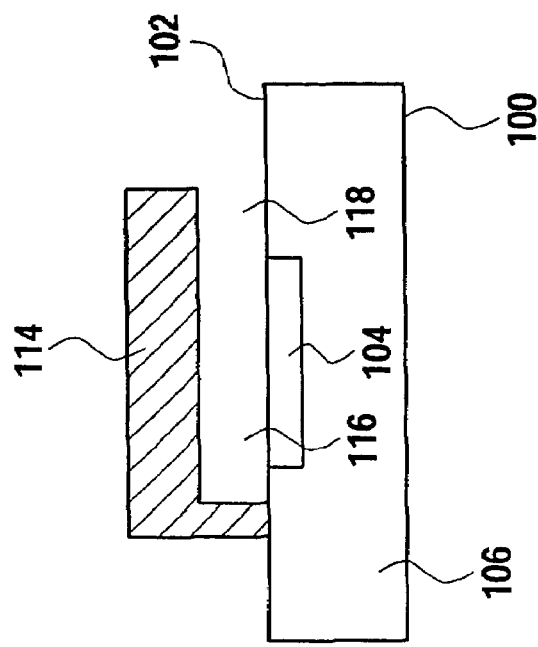
Figure 4:
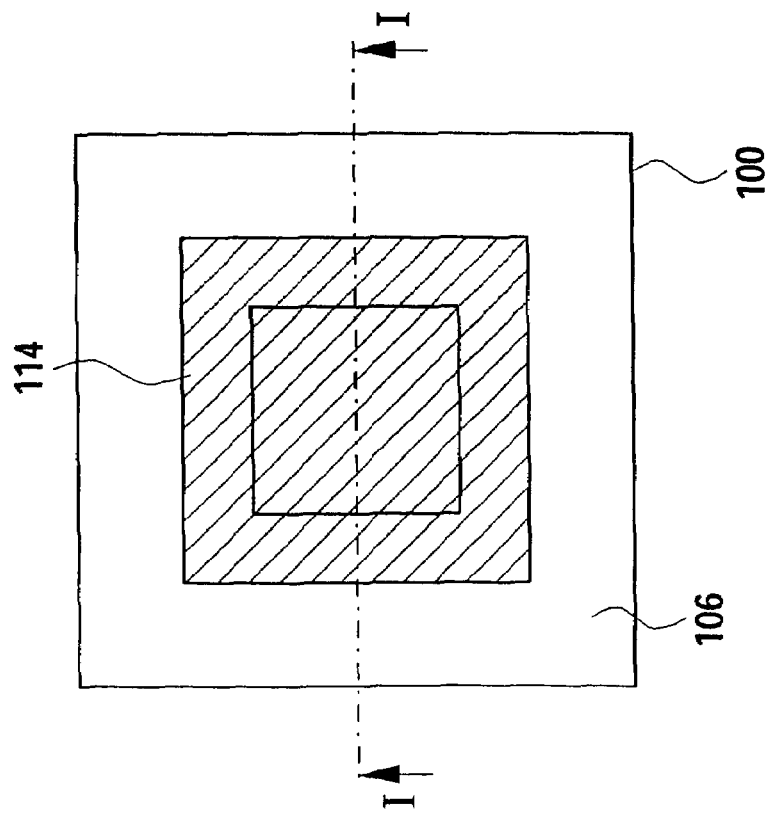
Figure 5:
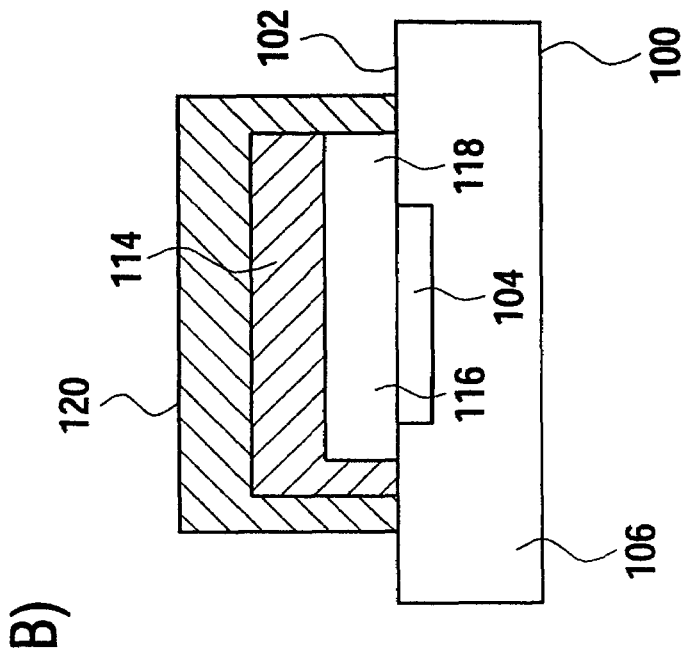
Figure 5:
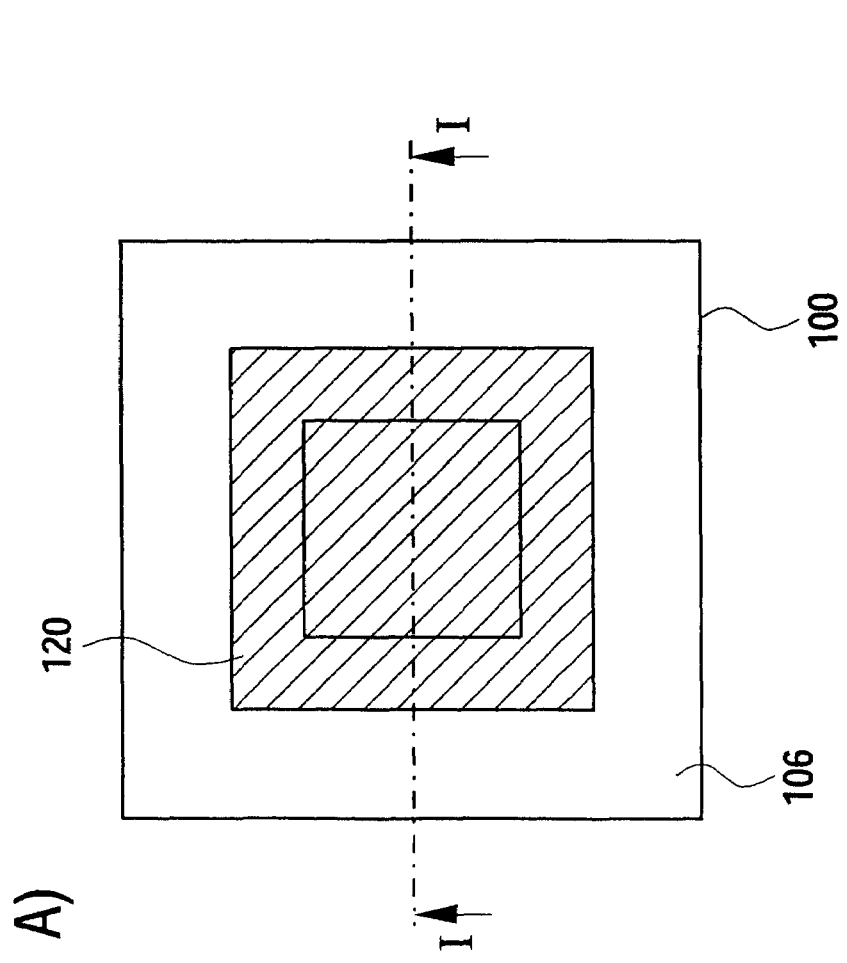

Finally, the cavity is closed by a further cover layer 120 being deposited on the structure, as it results in FIG. 4, as it is shown in FIG. 5. The cover layer 120 is deposited on the surface 102 and the structures formed there and structured, to close the cavity 116 and the channel for etching 118, wherein the cover layer 120 is preferably structured so as to completely enclose the first cover layer 114.

The structure resulting after the procedural step according to FIG. 5 may then be subjected to injection-molding housing, wherein it is then ensured here that functionality of the device is not impeded.

Figure 6:
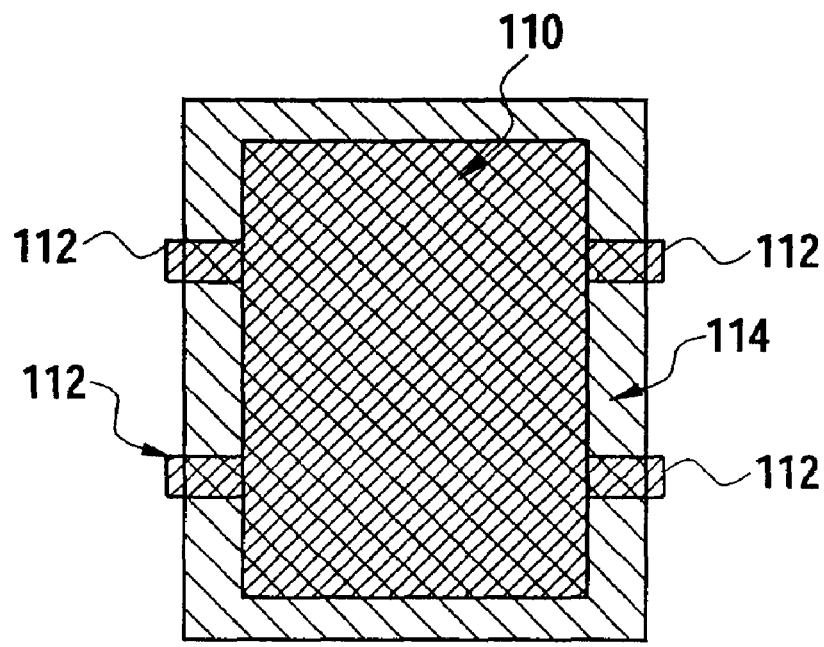
FIGS. 6A to D show a first preferred embodiment of the production method according to the invention.
Figure 6:
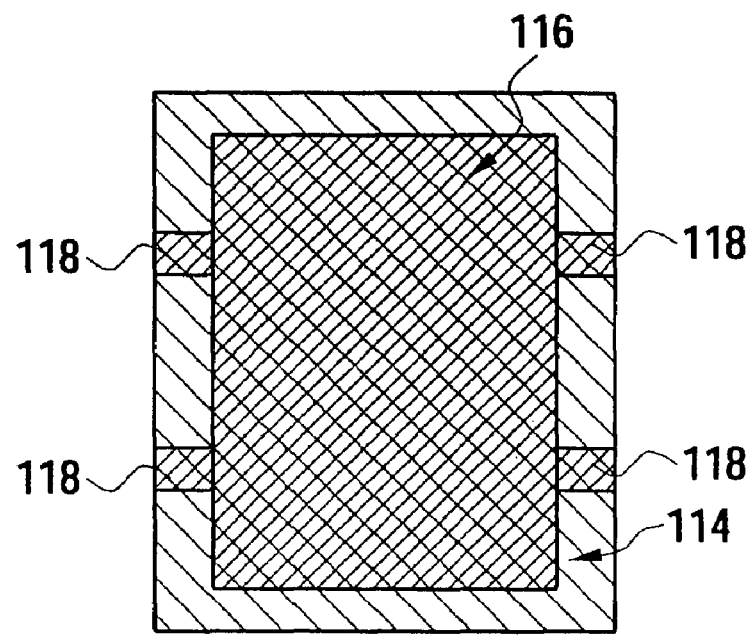
Figure 6:
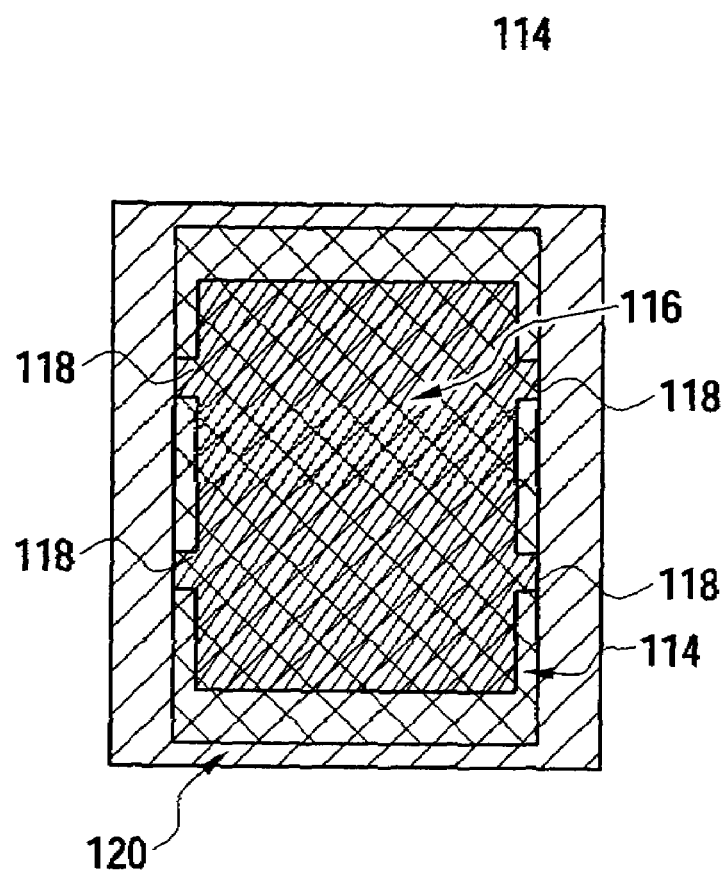
Figure 6:
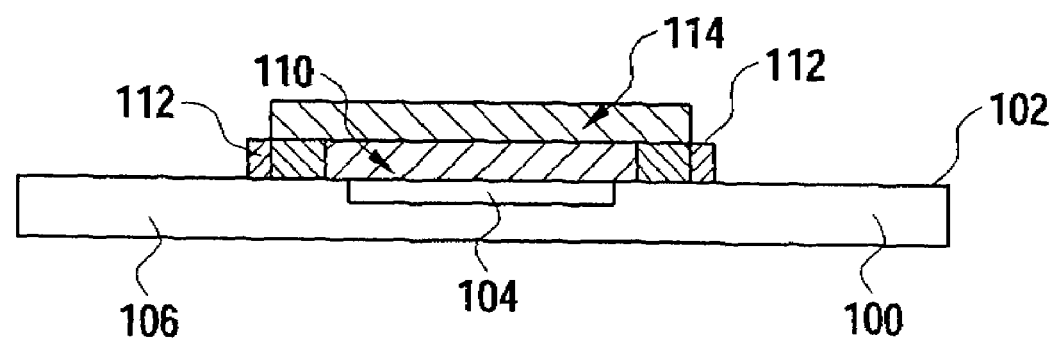

In FIG. 6 a first preferred embodiment of the inventive production method is illustrated, wherein here like reference numerals are provided for like elements. As can be seen from FIG. 6A, the sacrificial layer is structured there to provide four second portions 112 in order to enable quicker and more uniform removing thereof during the etching of the sacrificial structure. FIG. 6D shows a cross-sectional illustration of the illustration of FIG. 6A, and the steps required for the attainment of the structures according to FIGS. 6B and 6C have already been explained on the basis of FIGS. 1–5.

According to the invention, for example by the embodiment described on the basis of FIG. 6, the above-described problems, as they result in conventional approach, are avoided by a seed layer preferably being applied on the substrate/wafer. Then a photo-structurable resist is applied that is structured with the aid of a photomask. Doing this, the photo-resist is removed over the areas later to be protected by wafer level packaging. The photo-resist here serves as mask to let e.g. copper grow locally as sacrificial layer 108 by electroplating. The sacrificial layer 108 is structured so that the lateral channels 112 are created by it below the further photoresist 114 to be applied subsequently, which then represents lateral accesses 118 to the future cavity 118. Then the seed layer between the sacrificial layer blocks on the wafer is etched off, i.e. those portions of the wafer on which no sacrificial layer has been grown are freed from the seed layer. The sacrificial layer 108, e.g. copper, is then coated with the lacquer layer 114 so that the sacrificial layer 108 is completely covered therewith. Here, care is to be taken that the photoresist is resistant to the etching solution for the sacrificial layer, does not change chemically, and can also be applied as a thicker layer with greater end strength and hardness, wherein here e.g. the photoresist SU-8 of the MicroChem Company, USA may be used. This photoresist 114 is now structured, and here the ends of the sacrificial layer strips 112 forming the etching channels are left free at the sides of the sacrificial structure 108 so that the sacrificial layer may be dissolved through these channels. The advantage of this procedure is that the dimension of the lateral holes for etching—different from the photolithographically structured holes for etching described above in prior art—is independent of the lacquer thickness, the exposure dose, and the lateral sizes.

The structure from thick protective lacquer resulting after the exposing by means of etching is then dried. If the developed spaces are sensitive and tend to sticking when drying, a drying method in a super-critical point drier (SCPD) may also be chosen.

The protective structures so produced are then closed with a further photoresist layer 120 that may also be SU-8. This second photoresist layer should also be able to be applied as a thick layer, >20 μm, and be present with great hardness and end strength at the end of the process. The so-formed closing layer 120 may be structured at the end in order to expose contact pads and saw lines along which the elements formed on the wafer are then diced.

On the basis of FIG. 7 subsequently a further preferred embodiment of the inventive production method for a protective cover is explained in further detail. In this embodiment, for example a device with micromechanical structures is formed in the substrate, wherein the micromechanical structures are at least partially movable. FIG. 7A shows a top-view illustration of such a device formed in the substrate 100. The device is a sensor with a multiplicity of fixed electrodes 122 and with a multiplicity of movable electrodes 124. The movable electrodes 124 are mounted to a common portion 128 whose end portions 128a and 128b serve as springs and anchors for the movable structure. In FIG. 7A, a further sacrificial layer 130 that is used for the production of the movable structures and removed prior to the completion of the sensor so as to expose the movable structures still lying fixed in FIG. 7A is shown in a hatched manner.

FIG. 7B is a cross-sectional illustration and shows the sensor prior to the applying of the sacrificial layer for the cavity creation below a lid. In FIG. 7B, a sectional illustration is shown in which two sensor structures, as they are shown in FIG. 7A in top-view, are arranged side by side. As can be seen in FIG. 7B, the structures supporting the fixed electrodes 122 are formed there on the surface 102 of the substrate 100. Furthermore, the movable structures 128 are formed, wherein these are surrounded by the sacrificial layer 130. As can be seen, the sacrificial layer 130 surrounds the movable parts 128 completely and the outer sensor anchorages also carrying the electrodes 122 partially. The remaining areas of the sensor are formed by a further layer 132 that may consist of the same material as the sacrificial layer 130.

According to the invention, the sacrificial structure 108 being in contact with the further sacrificial structure 130 of the device in the area of the first portion 110, as it is shown, is applied on the structure illustrated in FIG. 7B, as it is shown in FIG. 7C. With the second portion 112, the sacrificial layer 108 extends out of this area 110 so as to later define the channel for etching. The cover layer 114 is applied on the so-produced structure 108, wherein it may here be provided to provide additional openings 134 in the cover layer 114 in order to expose further portions of the first portion 110 of the sacrificial layer 108.

Figure 7:
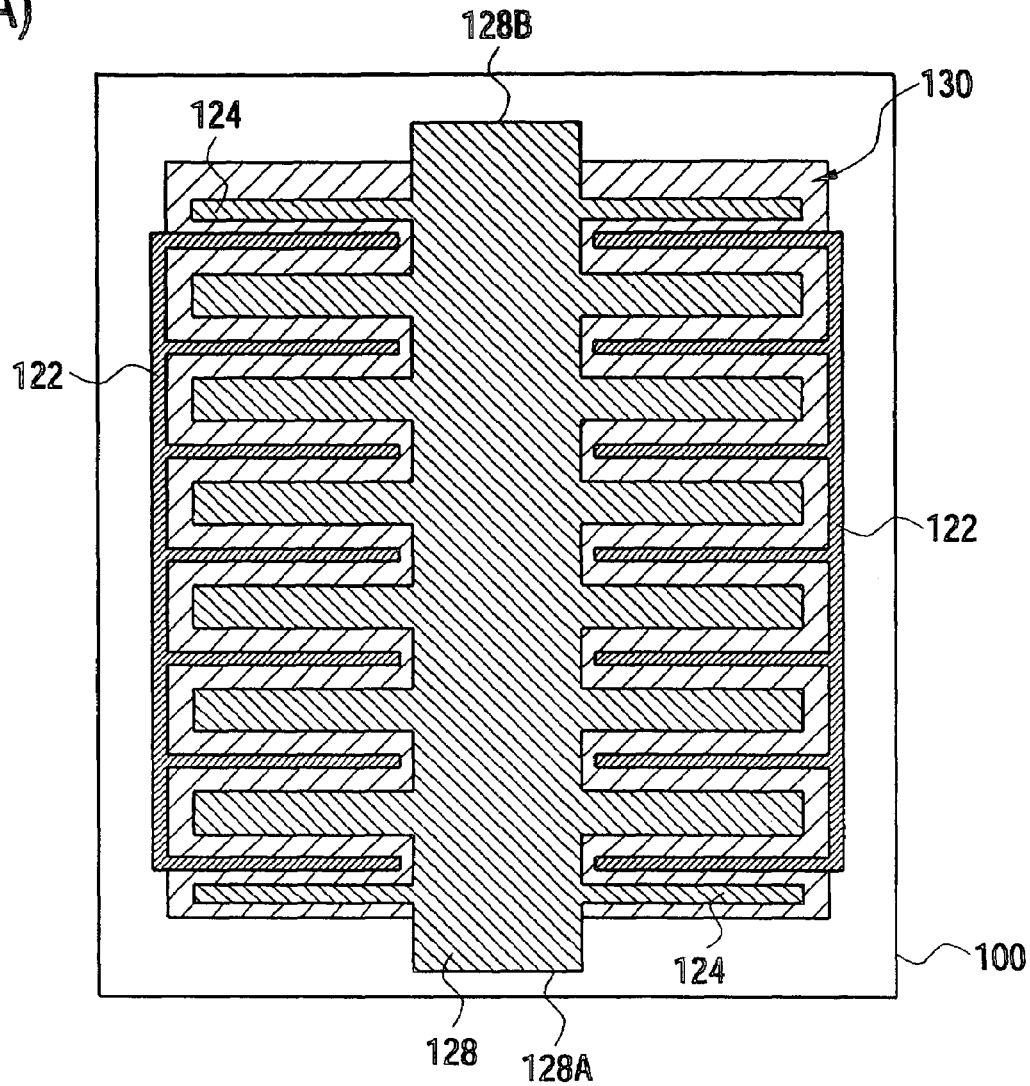
FIGS. 7A to D show a second preferred embodiment of the production method according to the invention.
Figure 7:
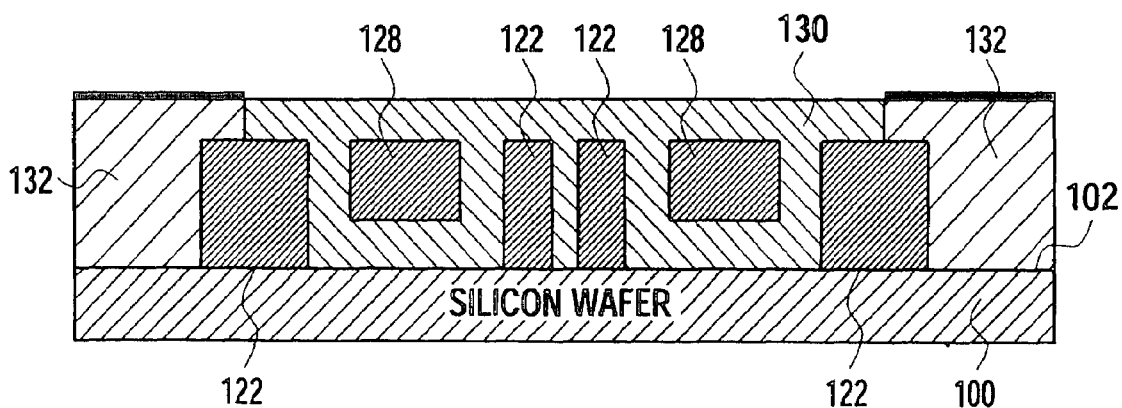
Figure 7:
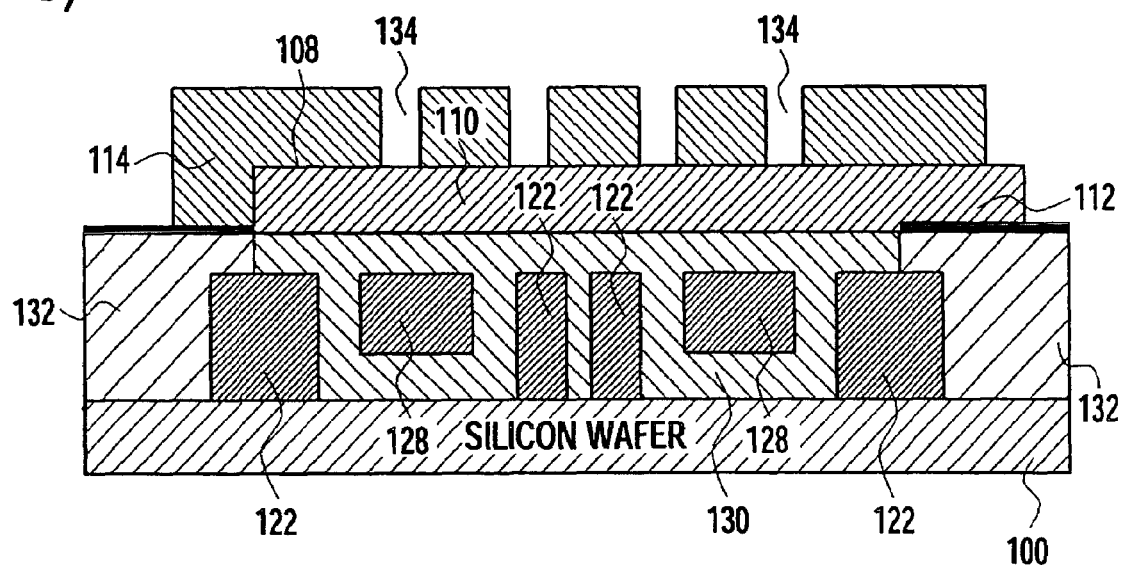
Figure 7:
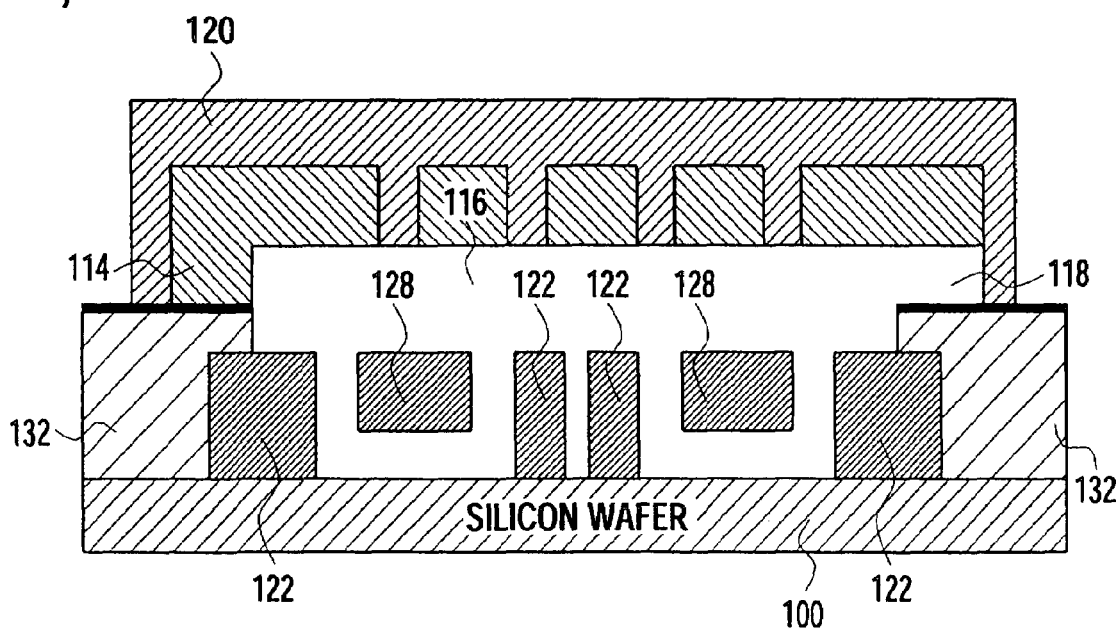

Regarding the embodiments described in FIG. 7, it is pointed out that here the further openings 134 that are for example inserted into the layer 114 by suitable lithography steps are not compelling, but it can also be worked with only the channel for etching. Alternatively, in the embodiment shown in FIG. 7, it may also be done without the channel for etching 112, so that here the sacrificial layer 108 as well as the sacrificial layer 130 may only be removed via the openings 134.

Then removal of the sacrificial layer 108 as well as the sacrificial layer 130 takes place by suitable means, whereby, as shown in FIG. 7D, the cavity 116 as well as the channel for etching 118 are created and also the movable parts 128 of the sensor structure are exposed by removing the further sacrificial layer 130. In addition, the further cover layer 120 is then applied to cover the cover layer 114 and concurrently close the openings as well as the channel 118 against the environment. Then an injection-molding housing for the element shown in FIG. 7D may be formed. If the element is fabricated on wafer level, a multiplicity of elements are on the wafer, and by the second cover layer 120 preferably contact pads and dicing lines along which the single elements may be diced are then defined.

According to the embodiment described in FIG. 7, the above-described problems with respect to the machining of micromechanical structures not yet exposed and thus being immobile are solved by the sacrificial layer 108 being applied and structured or applied in a structured manner. Then photoresist 114 is applied over the sacrificial layer 108, wherein care is to be taken that the photoresist is resistant to the etching solution for the sacrificial layer, does not change chemically, and may also be applied as a thicker layer with greater end strength and hardness. Here the material SU-8 also presents itself. The photo-resist 14 is then structured so that the holes for etching 118 result at the sides of the lid to be produced, so that the sacrificial layer may be accessed by a suitable etching medium.

Here, the following possibilities of procedure result:
(a) The sacrificial layer 108 on the structure is to be removed with other etchants or solvents than the sacrificial layer 130 in which the micromechanical structure is still embedded.
(b) The sacrificial layer 108 on the structure is to be removed with the same etchant or solvent as the sacrificial layer 130 in which the micromechanical structure is still embedded.

In case (a) the sacrificial layer lying below the thick photoresist 114 is removed by the suitable etchant or solvent. Then the micromechanical structure is exposed with the suitable solvent for the sacrificial layer 130 in which the micromechanical structure is still embedded. The structures from thick protective lacquer, e.g. SU-8, are then dried. If the lid and the micromechanical structure are sensitive and tend to sticking when drying, a drying method in a supercritical point drier (SCPD) may also be chosen here. Basically, other anti-sticking methods, however, such as the production of a mono-layer of a hydrophobic molecule, are also possible.

The now-present protective structures from stable photoresist 114 are coated with a further photoresist layer 120 and thus closed. This second photoresist layer 114 may also be SU-8. It should also be able to be applied as thick layer (>2 µm) and be present with great hardness and strength at the end of the process. The closing layer 120 is structured at the end to expose contact pads and saw lines.

In case (b) a change to a second etching or solving medium is now unnecessary. By extension of the process time, the sacrificial layer 130 of the micromechanical structure is also dissolved, and then it is being continued as described above in case (a).

If in case (a) the sacrificial layer 130 of the micromechanical structure, e.g. an oxide, is etched with a gas, e.g. HF, or as in case (b) both sacrificial layers, e.g. oxide, with a gas, e.g. HF, the anti-sticking measures in the further procedural course are omitted.

Although preferred embodiments of the present invention have been explained in greater detail above, it is obvious that the present invention is not limited to these embodiments. In particular, the present invention also finds application to other micromechanical devices, and furthermore the amount of channels for etching is not limited to the amount indicated on the basis of the figures.

While this invention has been described in terms of several preferred embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

What is claimed is:

1. Method for producing a protective cover for a device, wherein a substrate is provided that includes the device, the method including:
(a) creating a sacrificial structure on the substrate, wherein the sacrificial structure comprises a first portion covering a first area of the substrate including the device and a second portion extending from the first portion into a second area of the substrate including no device;
(b) depositing a first cover layer enclosing the sacrificial structure such that the second portion of the sacrificial structure is at least partially exposed;
(c) removing the sacrificial structure; and
(d) closing a cavity formed by the removal of the sacrificial structures, wherein step (a) includes:
(a.1) applying a photoresist layer on the substrate;
(a.2) structuring the photoresist layer to expose the first area completely and the second area of the substrate partially; and
(a.3) growing sacrificial material on the exposed areas of the substrate.

2. Method of claim 1, wherein step (b) includes:
(b.1) depositing a photoresist layer on the structure resulting after step (a) to completely enclose the sacrificial structure; and
(b.2) structuring the photoresist layer to expose an end of the second portion of the sacrificial structure facing away from the first portion of the sacrificial structure.

3. Method of claim 1, wherein step (c) includes:
etching or dissolving the sacrificial structure.

4. Method of claim 1, wherein step (d) includes:
(d.1) applying a second cover layer on the structure resulting after step (c); and
(d.2) structuring the second cover layer such that the second cover layer covers the first cover layer deposited in step (b) and closes the cavity formed by the removal of the sacrificial layer.

5. Method of claim 4, wherein the first cover layer and the second cover layer consist of the same material.

6. Method of claim 1, wherein step (b) further includes forming at least one opening in the first cover layer to expose a portion of the sacrificial structure, and wherein step (d) further includes closing the formed opening.

7. Method of claim 1, wherein the sacrificial structure is produced from a material including a photoresist, a metal, or an oxide.

8. Method of claim 1, wherein the device includes a micromechanical structure formed in the substrate with at least one movable part, wherein the movable part of the micromechanical structure in the substrate is fixed by a further sacrificial structure, wherein the sacrificial layer produced in step (a) at least partially borders on the further sacrificial layer, and wherein in step (c) the sacrificial structure and the further sacrificial layer are removed together in one step or successively in several steps to form the cavity and to expose the movable part of the micromechanical structure.

9. Method of claim 1, wherein the device is a SAW filter, a BAW filter, a resonator, a sensor or an actor.

10. Method of claim 1, wherein the substrate is a wafer including a plurality of identical or different devices, wherein in step (a) a sacrificial structure is produced for each of the devices by a sacrificial layer being applied on the wafer and patterned to define the sacrificial structure for each of the devices, wherein in step (b) the first cover layer is applied on the wafer and patterned to define a cover enclosing the sacrificial structure for each of the devices, wherein in step (c) all sacrificial structures are removed, and wherein in step (d) the cavities are closed.

11. Method of claim 10, wherein finally the wafer is diced.

12. Method of claim 10, wherein the structuring of the first cover layer includes the setting of dicing lines on the wafer.

13. Method of claim 10, wherein step (d) includes applying the second cover layer and structuring it to fix contact pads and dicing lines on the wafer.

14. Method for producing a protective cover for a device, wherein a substrate is provided that includes the device, the method including:
   (a) creating a sacrificial structure on the substrate, wherein the sacrificial structure comprises a first portion covering a first area of the substrate including the device and a second portion extending from the first portion into a second area of the substrate including no device;
   (b) depositing a first cover layer enclosing the sacrificial structure such that the second portion of the sacrificial structure is at least partially exposed;
   (c) removing the sacrificial structure; and
   (d) closing a cavity formed by the removal of the sacrificial structure, wherein step (b) includes:
      (b.1) depositing a photoresist layer on the structure resulting after step (a) to completely enclose the sacrificial structure; and
      (b.2) structuring the photoresist layer to expose an end of the second portion of the sacrificial structure facing away from the first portion of the sacrificial structure.

15. Method for producing a protective cover for a device, wherein a substrate is provided that includes the device, the method including:
   (a) creating a sacrificial structure on the substrate, wherein the sacrificial structure comprises a first portion covering a first area of the substrate including the device and a second portion extending from the first portion into a second area of the substrate including no device;
   (b) depositing a first cover layer enclosing the sacrificial structure such that the second portion of the sacrificial structure is at least partially exposed;
   (c) removing the sacrificial structure; and
   (d) closing a cavity formed by the removal of the sacrificial structure,
wherein the device includes a micromechanical structure formed in the substrate with at least one movable part, wherein the movable part of the micromechanical structure in the substrate is fixed by a further sacrificial structure, wherein the sacrificial layer produced in step (a) at least partially borders on the further sacrificial layer, and wherein in step (c) the sacrificial structure and the further sacrificial layer are removed together in one step or successively in several steps to form the cavity and to expose the movable part of the micromechanical structure.

* * * * *